PULSE GENERATOR

Filed April 23, 1963 2 Sheets-Sheet 1

INVENTORS
JUAN J. AMODEI &
JOSEPH R. BURNS
BY John V. Regan
Attorney

INVENTORS
JUAN J. AMODEI &
JOSEPH R. BURNS
John V. Regan
Attorney

United States Patent Office 3,249,772
Patented May 3, 1966

3,249,772
PULSE GENERATOR

Joseph R. Burns, Trenton, N.J., and Juan J. Amodei, Levittown, Pa., assignors to Radio Corporation of America, a corporation of Delaware

Filed Apr. 23, 1963, Ser. No. 275,005
9 Claims. (Cl. 307—107)

This invention relates to pulse generators, and more particularly to variable width pulse generators.

It is an object of this invention to provide a new and improved pulse generator.

It is another object of this invention to provide a pulse generator in which the width of the output pulses may be simply controlled.

It is another object of this invention to provide a pulse generator in which the width, waveshape and amplitude of the output pulses may be simply controlled.

A pulse generator in accordance with the invention utilizes charge storage diodes to produce the output pulses. Charge storage diodes are semiconductor diodes which exhibit a high conductance to positive signals applied in the forward direction (i.e., from anode to cathode) as well as a high conductance, for a period of time called the storage period, to positive signals applied in the reverse direction (i.e., from cathode to anode). At the end of the storage period, the reverse conductance of a diode decays abruptly to the usual low reverse conductance of a semiconductor diode. Thus, the reverse current through a charge storage diode exhibits an abrupt decrease or cuts off at the end of the storage period.

Alternating singals are applied to a pair of charge storage diodes which are serially connected together and poled in the same direction. Means are coupled to the storage diodes to derive a train of output pulses which are generated from said alternating signals by the abrupt decrease in the reverse conduction characteristic of the storage diodes. The leading edge of each output pulse is determined by the current cutoff point of one of said diodes and the trailing edge of each output pulse is determined by the current cutoff point of the other of said diodes.

Further in accordance with the invention, means are coupled to one of said diodes for controlling the width of said train of output pulses.

The novel features that are considered to be characteristic of this invention are set forth with particularity in the appended claims. The invention itself, however, both as to its organization and method of operation as well as additional objects and advantages thereof, will best be understood when read in conjunction with the accompanying drawing, in which:

Figure 1:
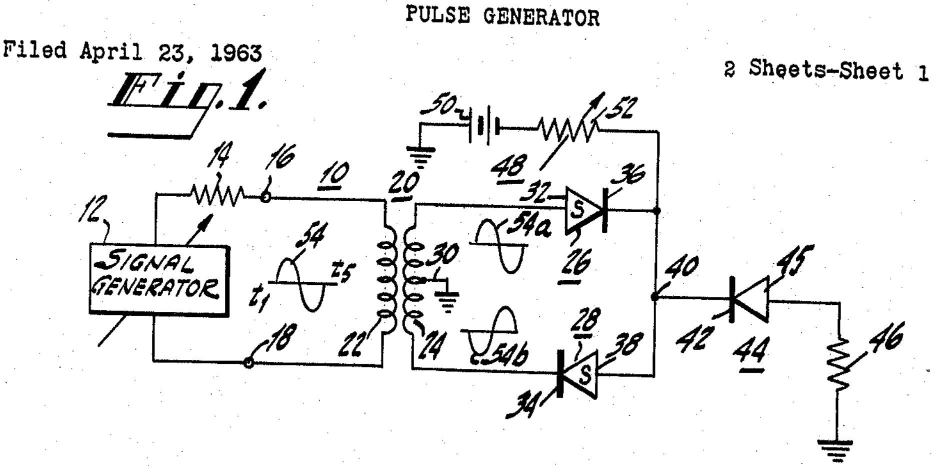
FIGURE 1 is a schematic circuit diagram of an embodiment of a pulse generator in accordance with the invention.

Referring now to FIGURE 1, a variable width pulse generator 10 includes a signal generator 12 for supplying alternating waves. The alternating waves may, for example, be sinusoidal because of the relative inexpense of sine wave generators, but any suitable alternating wave generator may be utilized. The signal generator 12 is variable both as to amplitude and frequency, as denoted by the arrow drawn therethrough. The signal generator 12 exhibits an internal impedance, as represented by the resistor 14, and includes a pair of output terminals 16 and 18. The resistance 14 of the generator 12 may be augmented by additional external resistance if desired.

A transformer 20, which includes a primary winding 22 and a secondary winding 24, is utilized to couple alternating waves from the signal generator 12 to a pair of charge storage diodes 26 and 28. The primary winding 22 of the transformer 20 is coupled across the terminals 16–18 of the signal generator 12. The secondary winding 24 includes a center tap 30 which is connected to a point of reference potential, or ground, in the circuit. The diodes 26 and 28 are poled in the same direction and serially connected across the secondary winding 24 of the transformer 20. Thus, the anode 32 of the first charge storage diode 26 is connected to one terminal of the secondary winding 24 while the cathode 34 of the second charge storage diode 28 is coupled to the other terminal thereof. The cathode 36 of the first diode 26 and the anode 38 of the second diode 28 are directly connected together. The junction or midpoint 40 of the series combination of the diodes 26 and 28 is coupled to the cathode 42 of a conventional semiconductor diode 44. The anode 46 of the diode 44 is coupled through a load 46 to ground. The load 46 is denoted by a resistor in FIGURE 1.

A current biasing circuit 48, which includes the series combination of a battery 50 and a variable resistor 52, is connected between the cathode 36 of the diode 26 and ground to provide a forward biasing current for this diode. The resistor 52 is selected to be appreciably larger than the load resistor 46, for example, on the order of ten times larger, in order to insure that the biasing circuit 48 functions as a current bias source rather than as a voltage bias source. The current biasing circuit 48 also provides a reverse bias for the diode 28. The sinusoidal output wave 54 of the signal generator 12 is effectively split by the grounded center tapped secondary winding 24 of the transformer 20 into a pair of alternating signals 54A and 54B so as to apply alternating signals of opposite polarity to the storage diodes 26 and 28.

Charge storage diodes have been described in the literature; see, for example, an article in the Proc. of the IRE, vol. 50, No. 1, January 1962, pages 43–52, entitled, "P–N Junction Charge Storage diode," by Moll et al. Charge storage diodes possess the same high conductance properties as conventional semiconductor diodes when biased in the forward direction, that is, with the anode of the storage diode positive with respect to the cathode thereof. However, upon being reverse biased, after a period of time under the forward bias condition, the storage diode is unlike the conventional semiconductor diode in that it exhibits a high conductance in the reverse direction for a period of time called the storage period which is then followed by an abrupt decrease in conductance. The conduction in the reverse direction is caused by the minority current carriers stored adjacent the junction of the charge storage diode during the interval of forward current conduction through the diode. At the end of the storage period, which is the time when the stored charges are depleted, the reverse current through the storage diode abruptly cuts off. Substantially no further reverse current flows until another interval of forward current conduction occurs. Thus, a charge storage diode effectively "snaps-off" after a period of conduction in the reverse direction. The transition from the high to the low conductance conditions or current cutoff point may, for example, be on the order of less than a quarter of a nanosecond duration, ($0.25 \times 10^{-9}$ secs.). The time duration or length of the storage period in a charge storage diode is dependent upon, inter alia, the magnitude of current flow through the diode in the forward direction before it is reverse biased. The greater the magnitude of current in the forward direction, the more stored charges are accumulated in the charge storage diode, and the longer it takes to reach current cutoff when driven to conduct in the reverse direction.

Figure 2:
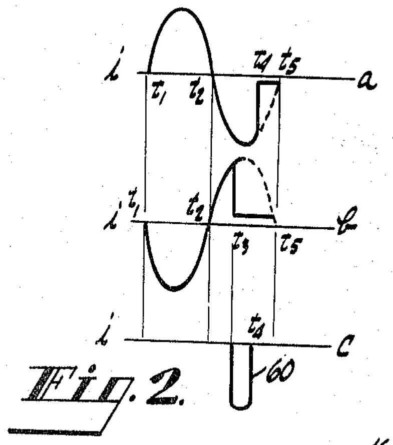
FIGURES 2 and 3 are graphs illustrating certain operational characteristics of the charge storage diodes utilized in FIGURE 1; and, FIGURES 4, 5 and 6 are schematic circuit diagrams of other embodiments of the invention.

IN FIGURE 2 there is shown a series of graphs illustrating the current flowing through portions of the circuit of FIGURE 1. FIGURES 2*a* and 2*b* illustrate the current through the diodes 26 and 28, respectively, when a full cycle of the alternating voltage signal 54 is applied to the transformer 20. FIGURE 2*c* is the output current through the load 46 during this cycle. To simplify the graphs of FIGURE 2, it will be assumed that the biasing cirrcuit 48 is not connected in the circuit of FIGURE 1 and the first diode 26 exhibits a longer storage period than the second diode 28.

During the time interval $t_1$–$t_2$, the applied voltage wave 54 is in the positive portion of its cycle and both the diodes 26 and 28 conduct in the forward direction. Substantially no current flows through the load 46 and thus no output is developed, as shown in FIGURE 2*c*. During the time interval $t_2$–$t_5$, the applied voltage wave 54 is in the negative portion of its cycle and both the diodes 26 and 28 are reverse biased. However, reverse conduction occurs initially in both the diodes 26 and 28 due to the stored charges therein. At the time $t_3$, the stored charges in the second storage diode 28 are depleted and the current therethrough abruptly decreases to the low reverse leakage current of a semiconductor diode, as shown in FIGURE 2*b*. The reverse current through the first storage diode 26 then flows through the load 46 and an output level or the leading edge of an output pulse 60 (FIGURE 2*c*) is developed. Thus, the leading edge of the output pulse 60 is determined by the current cutoff point of the second storage diode 28. The current cutoff point is in turn determined by the storage period exhibited by this diode.

The reverse conduction through the first diode 26 continues until the time $t_4$ due to its having a longer storage period than the second diode 28. The amplitude of the output pulse 60 (FIGURE 2*c*) during the time interval $t_3$–$t_4$ is determined by the amplitude of the current through the first diode 26. At the time $t_4$, the current cutoff point, the reverse current through the first diode 26 abruptly decreases to a low leakage current because the stored charges therein are depleted. Substantially no further reverse conduction occurs during the time interval $t_4$–$t_5$. Thus, the trailing edge of the output pulse 60 is determined by the current cutoff point of the first diode 26. The current cutoff point is in turn determined by the storage period exhibited by the first diode 26.

A train of negative-going output pulses 60 are produced from the applied alternating wave 54 and the pulse repetition rate of these pulses is determined by the frequency of the signal generator 12. The amplitude of the output pulses 60 is determined by the amplitude of the current flowing through the first diode 26, after the second diode 28 snaps off. Thus, the amplitude of the output pulses 60 is effectively determined by the amplitude of the applied alternating signal. The amplitude of the output pulses 60 is limited by the reverse breakdown voltage exhibited by the storage diodes 26 and 28 which may typically be on the order of 20 volts. The width of the output pulses 60 is determined by the different current cutoff points or the difference in storage periods exhibited by the first and second diodes 26 and 28.

The storage period of a charge storage diode is dependent upon, inter alia, the magnitude of current through the diode in the forward direction before being reverse biased. The current biasing source 48 is therefore added to the circuit of FIGURE 1 to forward bias the first diode 26. The biasing source 48 insures that the diodes 26 and 28 exhibit substantially different storage periods and also provides a relatively simple means for controlling the width of the output pulses 60. The conventional diode 44 prevents positive transients from being applied to the load 46. The magnitude of biasing current flowing through the load 46 is insignificant when compared to the amplitude of the output pulse.

Figure 3:
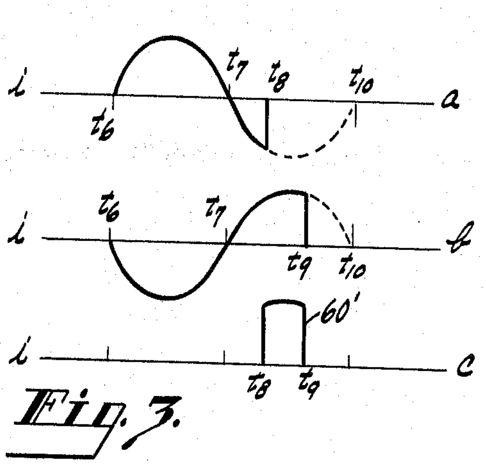

The polarity of the output pulses 60 depends upon which storage diode 26 or 28 snaps off first. In FIGURE 3, a positive output pulse 60' is produced by causing the second storage diode 28 to exhibit a longer storage period than the first storage diode 26. This may be accomplished simply by forward biasing the second diode 28 and not the first diode 26, say, by reversing the polarity of the battery 50. The poling of the conventional diode 44 is also reversed under these conditions. The alternating signal applied from the generator 12 to derive the curves in FIGURE 3 is also shown as lower in frequency and smaller in amplitude than that of FIGURE 2 to show the flexibility of the pulse generator 10 in producing a variety of differently shaped output pulses.

Figure 4:
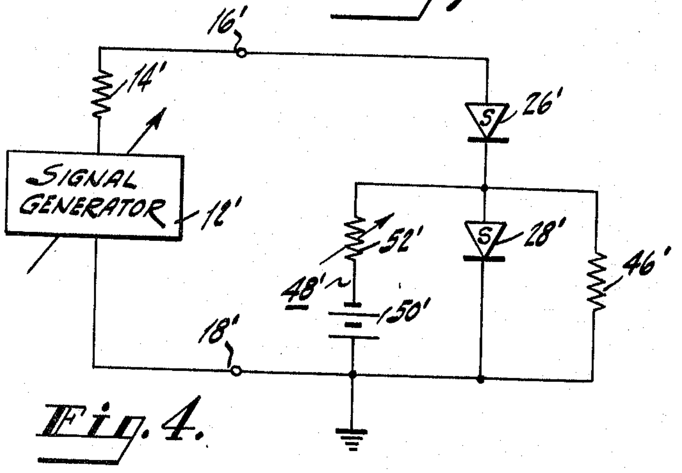

Referring now to FIGURE 4, another embodiment of the invention is shown. In this embodiment, components identical to those in FIGURE 1 have been given the same reference numerals but the numerals are primed. The first 26' and second 28' storage diodes are directly coupled across the terminals 16'–18' of the signal generator 12'. The load 46' is directly coupled across the second storage diode 28'. With this connection, it is important that the first storage diode 26' exhibit a greater storage period than the second storage diode 28' or else no output pulses will be developed. Therefore, the current biasing source 50' is connected to reverse bias the second storage diode 28' so as to reduce its storage period. It is to be noted that reverse biasing a storage diode has less affect on the storage period exhibited by the diode than forward biasing the diode with the same magnitude of biasing current.

In operation, the negative half cycle of the applied alternating signal from the generator 12' will drive reverse current through the series combination of the diode 26' and 28'. While the diode 28' is conducting, the high conductance exhibited by this diode prevents an output from being developed in the load 46'. When the diode 28' snaps off at the end of its storage period, the leading edge of a negative-going output pulse is produced by conduction through the load 46'. The output pulse decays abruptly when the first storage diode 26' snaps off at a later time. Thus, a train of regularly recurring output pulses are produced in the load 46'. Positive-going output pulses can be generated in the circuit of FIGURE 4 by simply reversing the poling of both the diodes 26' and 28' and the biasing source 48'. The biasing source 48' in FIGURE 4, as well as the source 48 in FIGURE 1, both cause a direct current to flow through the load. However, the magnitude of this current is insignificant when compared to the output pulse level.

Figure 5:
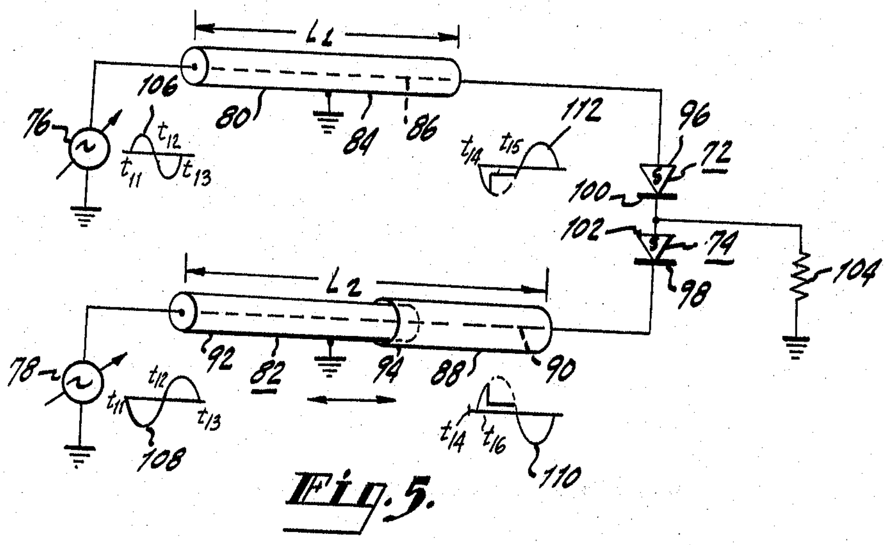

Referring now to FIGURE 5, another embodiment of a variable width pulse generator is shown. The pulse generator 70 includes a pair of charge storage diodes 72 and 74. In this embodiment, the diodes 72 and 74 do not have to exhibit different charge storage periods, so no current biasing supply is needed. Thus, an expensive item in the pulse generator is eliminated. A pair of alternating signal generators 76 and 78 which may be variable both as to frequency and amplitude are coupled to the diodes 72 and 74 by a pair of transmission lines 80 and 82. The transmission lines 80 and 82 are illustrated as coaxial lines although any other type transmission line, such as microstrip line, may be utilized. The transmission line 80 includes an outer conductor 84, which is grounded, and an inner conductor 86 which is insulated from the outer conductor 84. Similarly, the transmission line 82 includes a grounded outer conductor 88 and an inner conductor 90 insulated therefrom. The transmission line 80 has a fixed length $L_1$, while the line 82 is a variable length line including two sections 92 and 94, coaxially movable with respect to each other as shown by the double headed arrow in FIGURE 5. The length $L_2$ of the transmission line 82 is selected to differ from the length $L_1$ of the line 80 to introduce a different delay or phase shift into signals applied to the lines. Both lines may, for example, exhibit a characteristic impedance of 50 ohms.

The signal generator 76 is coupled to the input or sending end of the line 80 by connecting one terminal thereof to the inner conductor 86 of the line 80 and grounding the other terminal thereof. The signal generator 78 is similarly coupled to the sending end of the variable length line 82. The impedances of the signal generators 76 and 78 are respectively matched to the characteristic impedance of the lines 80 and 82 by suitable coupling means, not shown.

The diodes 72 and 74 are serially connected across the receiving end of the lines 80 and 82 by connecting the anode 96 of the diode 72 to the inner conductor 86 of the line 80 and the cathode 98 of the diode 74 connected to the inner conductor 90 of the line 82. The junction or midpoint of the connection from the cathode 100 of the diode 72 to the anode 102 of the diode 74 is coupled through a load, as represented by a resistor 104 in FIGURE 5, to ground.

In operation, the signal generator 76 generates an alternating wave of one phase, such as the sine wave 106 in FIGURE 5, while the generator 78 generates an alternating wave 108 of the opposite phase. The transmission line 82 is shown in FIGURE 5 as longer than the line 80, and thus the output signal 110 from line 82 is delayed more than the output signal 112 from the line 80. During the negative half cycle of the signal 110 and the positive half cycle of the signal 112, the diodes 72 and 74 conduct in the forward direction and the output currents therefrom substantially cancel in the load 104. Thus, substantially no output is developed in the load 104. If the signals 110 and 112 are exactly oppositely phased, the cancellation in the load 104 would be complete but with the different delays introduced by the transmission lines 80 and 82, some small output is developed in the load 104 during this time.

When the signals 112 and 110 swing negative and positive, respectively, the diodes 72 and 74 initially conduct in the reverse direction. However, the diode 72 abruptly cuts off, such as at a time $t_{15}$, before the diode 74. This is due to the fact that reverse conduction occurred in the diode 72 slightly earlier than in the diode 74 because of the greater delay introduced into the signal 110 by the transmission line 82. With only the diode 74 conducting, the reverse current through this diode flows through the load 104 developing an output therein. The diode 74 then abruptly cuts off, such as at a time $t_{16}$, preventing any further conduction through the load 104. Thus, a series of positive-going output pulses are developed with the leading and trailing edges thereof determined by the different times at which the reverse current cutoff points of the diodes 72 and 74 occur. The different cutoff points in this embodiment is not determined by different storage periods exhibited by the diodes 72 and 74 but rather by the different delays introduced by the transmission lines 80 and 82. By varying the electrical length of the line 82, variable width output pulses are produced. Extremely narrow pulses are obtainable throughout a range extending from low frequencies to microwave frequencies. The narrow output pulses exhibit little distortion due to the almost complete cancellation of signals in the load 104 when both the diodes 72 and 74 are conducting.

It is apparent that the storage periods of the diodes 72 and 74 need not be closely matched nor need they be greatly mismatched in order to produce the output pulses, since the length of the transmission line 82 may be adjusted to develop an output pulse with a desirable width. Furthermore, it is also apparent that only one signal generator, such as the generator 76, may be utilized by coupling the generator 76 to the sending ends of both the lines 80 and 82 and adjusting the length of the line 82 to introduce a phase shift of 180° plus or minus a differential phase shift $\phi$.

Figure 6:
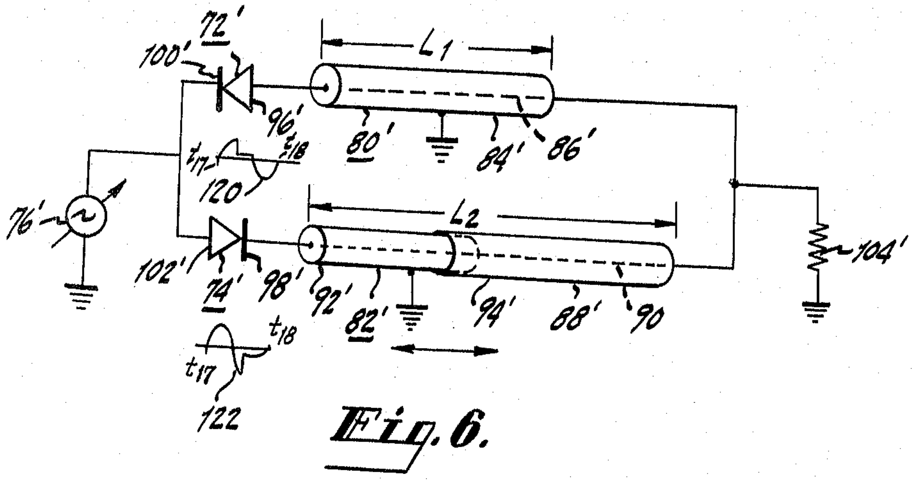

In FIGURE 6, there is shown another embodiment of the invention in which parts identical to those in FIGURE 5 have been given identical reference numerals but the numerals are primed. In this embodiment, a single signal generator 76' is coupled to the junction of a pair of serially connected storage diodes 72' and 74'. The anode 96' of the diode 72' is in turn coupled to the sending end of the transmission line 80' while the cathode 98' of the diode 74' is coupled to the sending end of the variable length transmission line 82'. The terminating ends of the transmission lines 80' and 82' are coupled through a load 104' to ground. Suitable impedance matching devices (not shown) may be coupled to the ends of the transmission lines 80' and 82' to reduce reflections.

It is to be noted that in this embodiment of the invention signals such as the signals 120 and 122 in FIGURE 6 are produced by the diodes 72' and 74', respectively, at the sending ends of the transmission lines 80' and 82'. The length $L_2$ of the adjustable length transmission line 82' is selected to exceed the length $L_1$ of the fixed length transmission line 80 and introduce a phase shift of 180° plus or minus a differential phase shift $\phi$. In this embodiment, the transmission line 82' introduces the 180° phase shift rather than the second signal generator 78 in the embodiment of FIGURE 5. Pulses are produced in the load 104' similar to the manner in which they are produced in the load 104 in the embodiment of FIGURE 5.

Thus, variable width pulse generators are provided in accordance with the invention. The leading and trailing edges of the output pulses produced exhibit extremely fast rise and fall times since they are determined by the decay periods or reverse current cutoff characteristics of a pair of storage diodes. Decay periods on the order of a quarter of a nanosecond are obtainable with presently available charge storage diodes. The width, waveshape, amplitude and polarity of the output pulses are all relatively simply controlled.

Typical pulse generators, according to the invention, may employ the following representative components:

| | |
|---|---|
| Source **12** | 100 megacycles, 5 volts peak. |
| Resistor **46** | 50 ohms. |
| Variable resistor **52** | 500 ohms and greater. |
| Diodes **26** and **28** | GE type SSD558. |
| Diode **44** | Conventional type MA4121. |

What is claimed is:

1. A pulse generator comprising in combination,
a pair of storage diodes serially connected together and poled in the same direction,
each of said diodes exhibiting an abrupt current cutoff point during conduction in the reverse direction after a period of conduction in the forward direction,
means for applying alternating signals to said diodes,
means coupled to said diodes for deriving output pulses each having a leading edge determined by the current cutoff point of one of said diodes and a trailing edge determined by the current cutoff point of the other of said diodes, and
means coupled to one of said diodes for controlling the width of said output pulses.

2. A pulse generator comprising in combination,
a pair of storage diodes serially connected together and poled in the same direction,
each of said diodes exhibiting an abrupt current cutoff point during conduction in the reverse direction after a period of conduction in the forward direction,
means for applying alternating signals to the series combination of said storage diodes, means coupled to the midpoint of the series combination of said storage diodes for deriving a train of output pulses each having a leading edge determined by the current cutoff point of one of said storage diodes and a trailing edge determined by the current cutoff point of the other of said diodes, and means coupled to one of said diodes for controlling the width of said output pulses.

3. A pulse generator comprising in combination, a pair of storage diodes serially connected together and poled in the same direction, means for applying alternating signals to the series combination of said storage diodes, means coupled to the midpoint of the series combination of said storage diodes to derive a train of output pulses each having a leading edge determined by the storage period exhibited by one of said storage diodes and a trailing edge determined by the storage period exhibited by the other of said diodes, and current biasing means coupled to one of said diodes to control the storage period thereof.

4. A pulse generator comprising in combination, first and second storage diodes with unlike electrodes connected together at a junction, each of said diodes exhibiting an abrupt current cutoff point during conduction in the reverse direction after a period of conduction in the forward direction, means for applying alternating signals to the junction of said storage diodes, first and second transmission lines coupled at one end to the other electrodes of said first and second storage diodes respectively, a load coupled to the other end of said transmission lines, and means for adjusting the length of one of said transmission lines to introduce a different phase shift into signals derived from said first and second storage diodes to produce output pulses in said load with each of said output pulses having a leading edge determined by the current cutoff point of said first storage diode and a trailing edge determined by the current cutoff point of said second storage diode.

5. A pulse generator comprising in combination, first and second storage diodes serially connected together and poled in the same direction, means for applying alternating signals to the series combination of said storage diodes, current biasing means coupled to bias said second storage diode to control the storage period thereof, and means coupled across said second storage diode to derive a train of output pulses each having a leading edge determined by the storage period exhibited by said second storage diode and a trailing edge determined by the storage period exhibited by said first storage diode.

6. A pulse generator comprising in combination, a pair of storage diodes serially connected together and poled in the same direction, each of said diodes exhibiting an abrupt current cutoff point during conduction in the reverse direction after a period of conduction in the forward direction, means for applying an alternating signal of one polarity to one of said diodes and an alternating signal of substantially the opposite polarity to the other of said diodes, and means coupled to the midpoint of the series combination of said storage diodes to derive a train of output pulses each having a leading edge determined by the current cutoff point of one of said storage diodes and a trailing edge determined by the current cutoff point of the other of said storage diodes.

7. A pulse generator comprising in combination, a pair of storage diodes serially connected together and poled in the same direction, each of said diodes exhibiting an abrupt current cutoff point during conduction in the reverse direction after a period of conduction in the forward direction, means for applying first and second alternating signals of different phases to the series combination of said diodes, and means coupled to the midpoint of the series combination of said diodes to derive a train of output pulses each having a leading edge determined by the current cutoff point of one of said diodes and a trailing edge determined by the current cutoff point of the other of said diodes.

8. A variable width pulse generator comprising in combination, a pair of storage diodes serially connected together and poled in the same direction, means for applying an alternating signal of one polarity to one of said storage diodes and an alternating signal of the opposite polarity to the other of said storage diodes, means coupled to the midpoint of the series combination of said storage diodes to derive a train of output pulses each having a leading edge determined by the storage period exhibited by said one storage diode and a trailing edge determined by the storage period exhibited by said other storage diode, and current biasing means coupled to forward bias said other storage diode to control the storage period thereof and the width of said output pulses.

9. A variable width pulse generator comprising in combination, an alternating signal generator, a transformer having a primary winding coupled to said signal generator, and a center-tapped secondary winding, first and second storage diodes poled in the same direction and serially connected across said secondary winding to have applied thereto oppositely phased alternating signals, means coupled from midpoint of the series combination of said storage diodes to the center tap of said secondary winding to derive a train of output pulses generated by said storage diodes from said alternating signals, each of said output pulses having a leading edge determined by the storage period exhibited by said second storage diode and a trailing edge determined by the storage period exhibited by said first storage diode, and current biasing means coupled from said midpoint to the center tap of said secondary winding to forward bias said first storage diode to control the storage period thereof and consequently the width of said output pulses.

References Cited by the Examiner

UNITED STATES PATENTS

| | | | |
|---|---|---|---|
| 3,135,934 | 6/1964 | Schoenike | 307—88.5 |
| 3,161,816 | 12/1964 | Holcomb | 307—88.5 |

MILTON O. HIRSHFIELD, *Primary Examiner.*

J. J. SWARTZ, *Assistant Examiner.*